United States Patent
Kotani et al.

(10) Patent No.: US 6,727,028 B2
(45) Date of Patent: Apr. 27, 2004

(54) PATTERN FORMATION METHOD, MASK FOR EXPOSURE USED FOR PATTERN FORMATION, AND METHOD OF MANUFACTURING THE SAME

(75) Inventors: Toshiya Kotani, Sagamihara (JP); Satoshi Tanaka, Kawasaki (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 10/132,197

(22) Filed: Apr. 26, 2002

(65) Prior Publication Data

US 2002/0160279 A1 Oct. 31, 2002

(30) Foreign Application Priority Data

Apr. 27, 2001 (JP) ........................................ 2001-130969

(51) Int. Cl.[7] ................................................. G03F 9/00
(52) U.S. Cl. .............................................. 430/5; 430/30
(58) Field of Search ................................ 430/5, 22, 30, 430/311, 323, 396

(56) References Cited

U.S. PATENT DOCUMENTS 5,885,734 A * 3/1999 Pierrat et al. .................. 430/5

FOREIGN PATENT DOCUMENTS

| JP | 2-177558 | 7/1990 |
| JP | 9-319067 | 12/1997 |
| JP | 2000-208401 | 7/2000 |

* cited by examiner

*Primary Examiner*—Mark F. Huff
*Assistant Examiner*—Saleha Mohamedulla
(74) *Attorney, Agent, or Firm*—Finnegan, Henderson, Farabow, Garrett & Dunner, L.L.P.

(57) ABSTRACT

In a pattern forming method, a cell pattern of each of memory cells is separated into a first pattern group provided at a predetermined position inside from an endmost portion of a cell and a second pattern group excluding the first pattern group. A mask size of the second pattern group is determined such that the second pattern group secures a sufficient process margin relative to a given size and size accuracy. A mask size of the first pattern group is optimized according to a peripheral pattern environment such that the first pattern group has a desired size under the above condition. A mask pattern of the memory cell is formed according to the mask size of the second pattern group and the first pattern group. The cell pattern is formed on a semiconductor wafer, using the mask pattern.

20 Claims, 5 Drawing Sheets

PATTERN FORMATION METHOD, MASK FOR EXPOSURE USED FOR PATTERN FORMATION, AND METHOD OF MANUFACTURING THE SAME

CROSS-REFERENCE TO RELATED APPLICATIONS

This application is based upon and claims the benefit of priority from the prior Japanese Patent Application No. 2001-130969, filed Apr. 27, 2001, the entire contents of which are incorporated herein by reference.

BACKGROUND OF THE INVENTION

1. Field of the Invention

The present invention relates generally to a pattern formation method, a mask for exposure used for pattern formation, and a method of manufacturing the same, and more specifically to a mask for exposure used in the manufacture of a semiconductor device such as an IC or an LSI, a method of manufacturing the mask for exposure, and a pattern formation method using the mask for exposure.

2. Description of the Related Art

In recent years, semiconductor manufacturing techniques have made remarkable progress. At present, volume production of a semiconductor chip having a pattern size in which the minimum processing size is 0.18 μm has commenced. Such a scaled-down semiconductor device has been made possible due to quantum leaps in micropattern forming techniques. Examples of micropattern forming techniques are mask processes, optical lithography, and etching.

In the era of sufficiently large pattern sizes, a device pattern substantially the same as a design pattern could be formed. For example, if the size of a semiconductor device to be manufactured is sufficiently large, the device pattern thereof is drawn on a mask substrate as a design pattern. Then a mask pattern (mask for exposure) the same as the design pattern is formed. The mask pattern is transferred onto a wafer, on which a underlying layer is formed, by an optical projection system. The underlying layer is etched in accordance with the resist pattern thus formed. Thereby, device patterns having substantially the same pattern size as that of the design pattern can be formed on the wafer.

However, the accuracy of the pattern formation in each process has deteriorated in parallel with advances in scaling-down semiconductor devices. This causes a problem that the resultant size (pattern size) on the wafer does not coincide with that of the design pattern. In the processes of lithography and etching especially, the layout environment of the peripheral portion of a pattern to be formed (peripheral pattern environment) greatly influences the accuracy of the resultant pattern size. As a method of reducing such influences, correction techniques such as OPC (Optical Proximity Correction) or PPC (Process Proximity Correction) are already known. The optical proximity correction technique is a technique of adding, in advance, an auxiliary pattern to a design pattern, so that the resultant pattern after being processed is formed in a desired size (refer, for example, to Jpn. Pat. Appln. KOKAI Publication No. 9-319067).

Also in recent years, a technique called "resolution enhancement technique (RET)" has become indispensable. With the RET, a lithography process margin can be improved in forming a pattern such as a memory cell having a plurality of fine patterns densely packed. On the other hand, however, the influence of OPE (Optical Proximity Effects) becomes considerably larger than when not using RET. More specifically, it is assumed that a high-density portion and a low-density portion are exposed with an exposure dose by using a mask pattern of the same size. In such a case, a desired size pattern can be obtained in the high-density portion. On the other hand, in the low-density portion, the size may be smaller or larger than a desired size.

For example, in the case of a memory cell, the layout (density) of the cell pattern (device pattern) considerably varies between the central portion of the cell and the end portion thereof (hereinafter referred to as "cell end"). Thus, collapse of a resist pattern occurs in the cell end (low-density portion in this case) because of the large OPE. In order to avoid this problem, in general, a method of disposing a predetermined number of extra dummy patterns in the endmost portion of the cell (further outside of the cell end) is adopted (refer, for example, to Jpn. Pat. Appln. KOKAI Publication No. 2-177558). Alternatively, only the size of the resist pattern in the cell end is made larger (or smaller) than that of the central portion of the cell. Thereby, collapse of the resist pattern in the cell end is avoided.

However, if dummy patterns are disposed, the area of a cell increases, which causes upsizing of a chip and leads to reduction in competitiveness in manufacturing of a semiconductor device. Further, even if only the size of the mask pattern at the cell endmost is varied, a finished size on the wafer at/near the cell end changes because the optical proximity effects depend on the peripheral pattern environment of about 5 μm at maximum (generally, 2 to 3 μm). Consequently, it's difficult to obtain sufficient cell/device characteristics.

BRIEF SUMMARY OF THE INVENTION

According to a first aspect of the present invention, there is provided a pattern formation method comprising: separating a memory cell pattern of each of a plurality of memory cells into a first pattern group provided at a predetermined position inside from an endmost portion of a cell and a second pattern group excluding the first pattern group;

determining a mask size of the second pattern group such that the second pattern group secures a sufficient process margin relative to a given size and size accuracy;

optimizing a mask size of the first pattern group according to a peripheral pattern environment such that the first pattern group has a desired size under a condition for determining the mask size of the second pattern group;

forming a mask pattern of the memory cell according to the mask size of the second pattern group determined and the mask size of the first pattern group optimized; and forming the cell pattern on a semiconductor wafer, using the mask pattern.

According to a second aspect of the present invention, there is provided a method of manufacturing a mask for exposure comprising:

separating a memory cell pattern of each of a plurality of memory cells into a first pattern group provided at a predetermined position inside from an endmost portion of a cell and a second pattern group excluding the first pattern group;

determining a mask size of the second pattern group such that the second pattern group secures a sufficient process margin relative to a given size and size accuracy;

optimizing a mask size of the first pattern group according to a peripheral pattern environment such that the first pattern group has a desired size under a condition for determined the mask size of the second pattern group; and forming a mask pattern of the memory cell according to the mask size of the second pattern group determined and the mask size of the first pattern group optimized.

According to a third aspect of the present invention, there is provided a mask for exposure used when a memory cell pattern of a plurality of memory cells comprises a first pattern group provided at a predetermined position inside from an endmost portion of a cell, and a second pattern group excluding the first pattern group, wherein the mask for exposure comprises a mask pattern of the memory cell formed according to a mask size of the first pattern group and a mask size of the second pattern group, the mask size of the second patter group which forms the mask pattern is determined by such a condition that the second pattern group secures a sufficient process margin relative to a given size and size accuracy, and the mask size of the first pattern group which forms the mask pattern is optimized according to a peripheral pattern environment such that the first pattern group has a desired size under the condition.

DETAILED DESCRIPTION OF THE INVENTION

An embodiment of the present invention will be described with reference to the drawings.

(First Embodiment)

A first embodiment of the present invention will be described referring to FIGS. 1A and 1B, FIG. 2, FIG. 5 and FIG. 6.

Figure 1A:
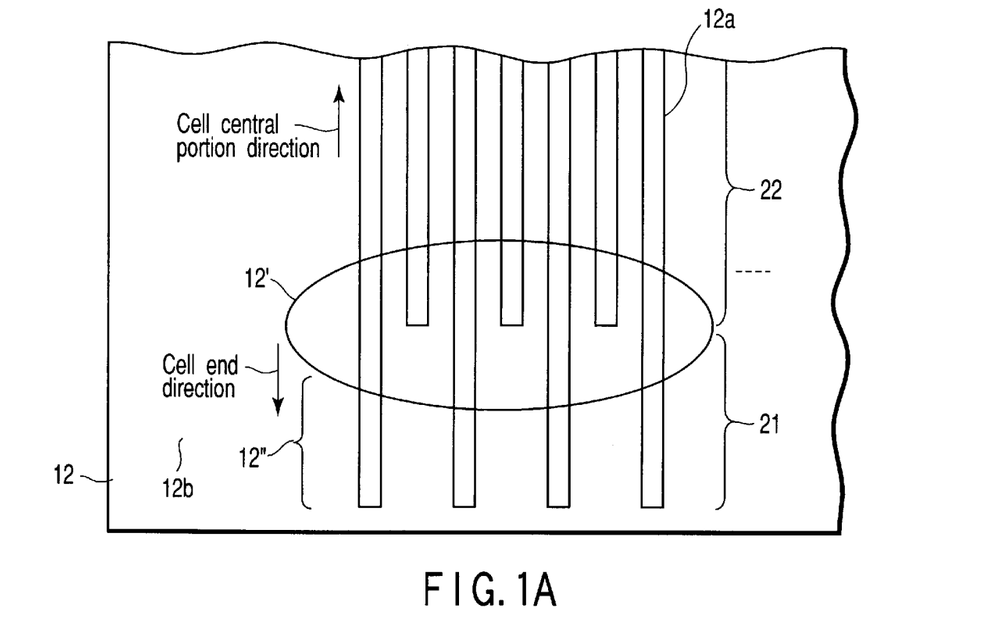
FIG. 1A is a plan view showing a finished state of a cell pattern according to a first embodiment of the present invention and, in particular, a lead-out portion of a gate layer in a memory cell by way of example.
Figure 1B:
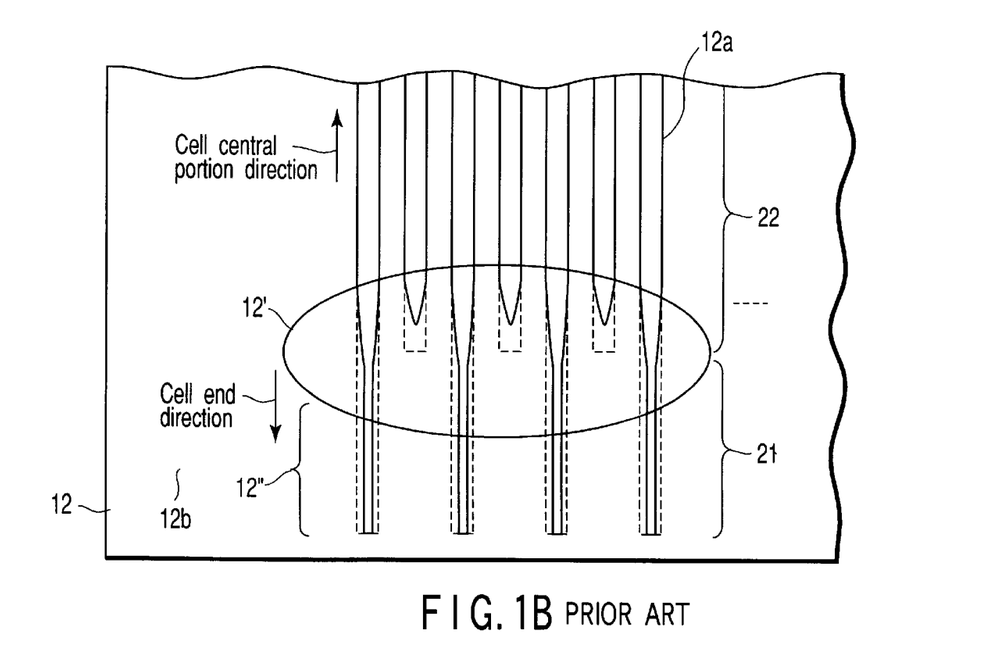
FIG. 1B is a plan view showing a prior-art cell pattern for comparison with the cell pattern shown in FIG. 1A.
Figure 2:
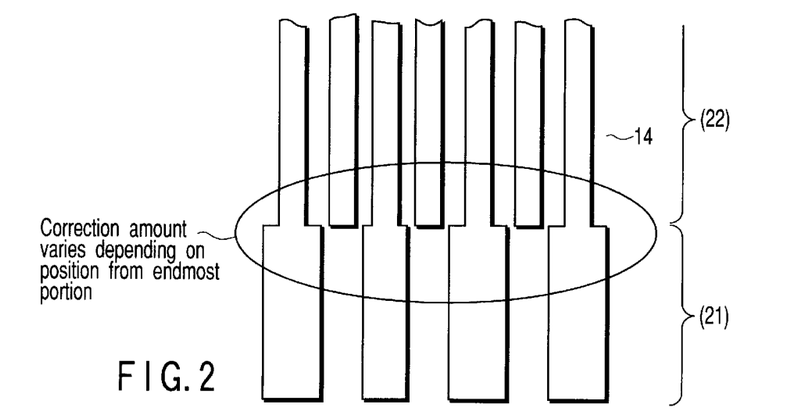
FIG. 2 is a plan view showing an example of a mask pattern used for formation of the lead-out portion shown in FIG. 1A.
Figure 5:
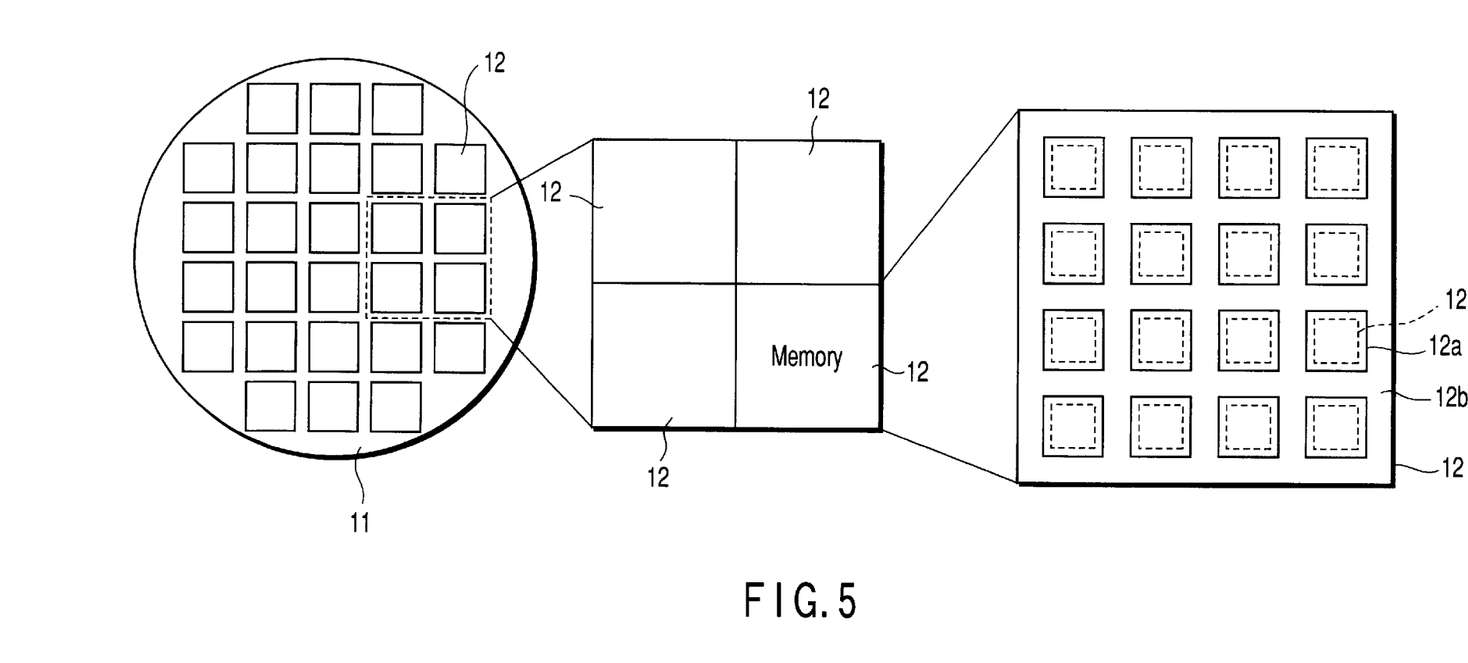
FIG. 5 is a plan view showing an example of a structure of a semiconductor wafer on which a plurality of chips having a memory cell and a peripheral circuit are formed.
Figure 6:
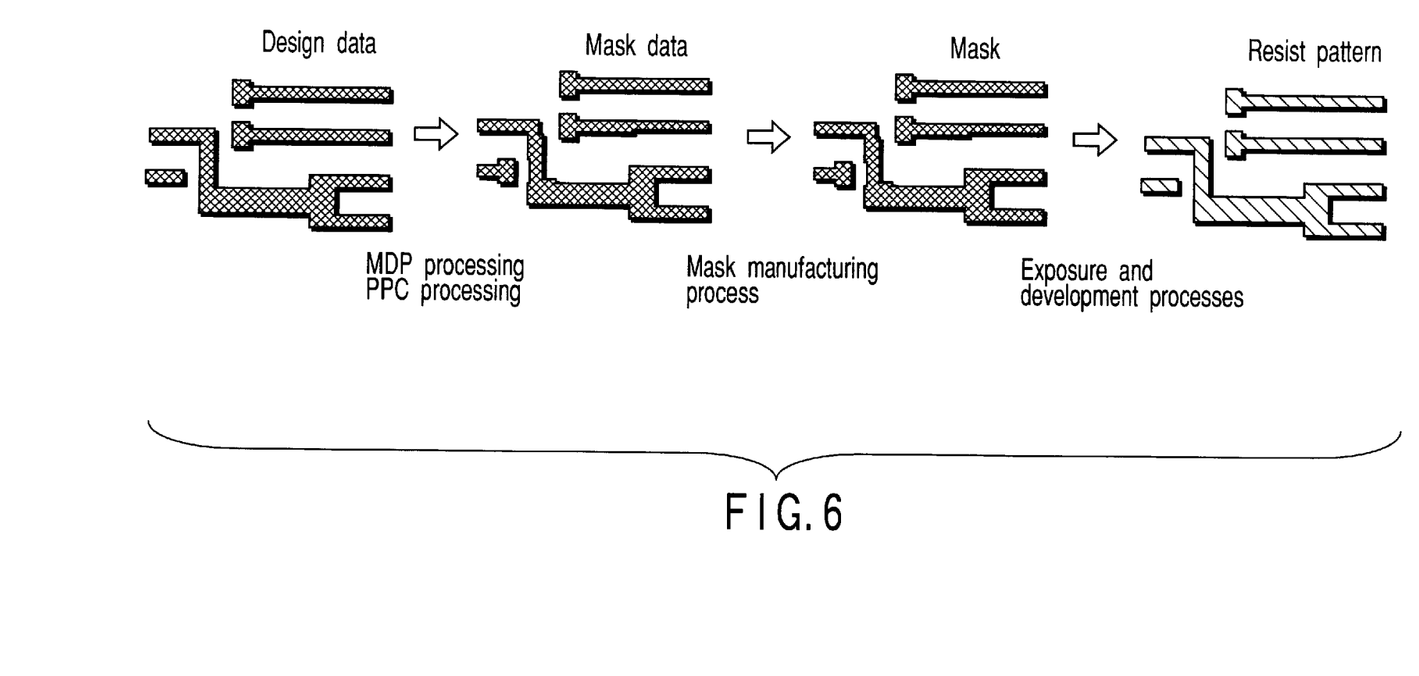
FIG. 6 is a view showing a process flow from formation of design data to formation of a resist pattern on a wafer.

FIGS. 1A and 1B each show a finished state of a cell pattern (device pattern), in particular, a lead-out portion of a gate layer in a memory cell, for comparison. FIG. 1A is a plan view of a cell pattern according to a first embodiment of the present invention, and FIG. 1B is a plan view of a prior-art cell pattern. FIG. 2 is a plan view of a mask pattern used for formation of the lead-out portion. FIG. 5 is a plan view showing a semiconductor wafer on which a plurality of chips having a memory cell and a peripheral circuit are formed. FIG. 6 is a view showing a wafer exposure flow, from formation of design data to formation of a resist pattern on a wafer.

As shown in FIG. 5, a plurality of chips 12 are formed on a wafer 11 made of silicon, or the like. After the wafer 11 is subjected to a predetermined processing, each chip 12 is separated and cut out. In general, a plurality of chips 12 having the same device pattern are formed on one wafer 11. In each chip 12 of this embodiment, a plurality of memory cells 12a, for example, are arranged in a matrix. A peripheral circuit 12b is formed on a peripheral portion of each chip 12 and between the memory cells 12a.

In such a structure, in forming a plurality of chips 12 on the wafer 11, design data is formed in order to draw, as a design pattern, a cell pattern of the memory cell 12a, etc., to be formed on the wafer 11, as shown in FIG. 6, for example. Then, the design pattern is subjected to a mask design processing and PPC processing, to obtain mask data corresponding to a mask pattern in a predetermined form. On the basis of the mask data, a mask for exposure is manufactured according to the mask manufacturing process. The mask pattern is transferred onto the wafer 11 using an optical projection system (exposure, and development processes). The wafer 11 comprises a underlying layer such as a polysilicon layer or a metal layer, and a resist coated thereon. The resist pattern is thus formed, and afterwards, the underlying layer is etched in accordance with the resist pattern. In this manner, a cell pattern having a pattern size substantially the same as that of the design pattern can be formed on the wafer 11.

FIG. 1A shows a pattern lead-out portion of a gate layer made of polysilicon, or the like, in the memory cell 12a. In the memory cell (cell pattern) 12a formed on the chip 12, a cell lead-out portion 12" is disposed in an endmost portion running from a cell end 12'. As described above, the region called the "cell lead-out portion" exists, in general, at one end of the gate layer or metal layer of the memory cell 12a. This region is provided for connecting the memory cell 12a to the peripheral circuit 12b, disposed in the peripheral portion of the chip 12 and between the memory cells 12a. The peripheral pattern environment of the cell lead-out portion 12" differs from that of the memory cell 12a. More specifically, the regularity (L/S (Line and Space)) of the pattern in the region called the "cell lead-out portion 12""" is different from that of the pattern in the memory cell 12a. Thus, the influence of the optical proximity effects is brought to the fore.

In this embodiment, a pattern group (first pattern group) 21 comprising the cell lead-out portions 12" is separated from a pattern group (second pattern group) 22 excluding the first pattern group. As a method used in the above case, the following method is conceivable:

① A memory cell is designed in advance, using a layer which specifies the cell lead-out portion 12", such that the cell lead-out portion 12" may be formed; and ② Only a pattern which characterizes the cell lead-out portion 12" is extracted by using a design rule checker, and only the extracted pattern is replaced with another layer.

Of the pattern groups thus extracted, the mask size of the second pattern group 22 is determined by experiment or calculation. In such a case, the mask size is determined so as to secure a sufficient lithography margin relative to the size target and size specifications required for an exposure apparatus used and resist performance. The μmount of light exposure needed is also determined at the same time as determining the mask size of the second pattern group 22.

It is assumed that a mask pattern having the same pattern size is used for both the second pattern group 22 and first pattern group 21, and they are exposed with the same amount of light exposure, as in the prior art. As described above, the regularity of the pattern is different between the first pattern group 21 and second pattern group 22. Thus, as shown in FIG. 1B, for example, the finished size of the cell pattern indicated by a solid line may be thinner (there may be cases where it is thicker) than the size target indicated by a dotted line.

Only the first pattern group 21 was subjected to PPC processing, and the mask size (correction amount) most suitable for the first pattern group 21 was calculated. The mask size of the first pattern group 21 is determined by the peripheral pattern environment disposed within 5 μm (preferably, 2 to 3 μm) from each pattern. In this manner, after optimizing the mask size of all the cell patterns of the first pattern group 21, the mask size of the first pattern group 21 is matched with that of the second pattern group 22. The mask pattern of the memory cell 12a was thus formed. Then, a mask 14 for exposure such as a photomask, which corresponds to the above mask pattern, was prepared (FIG. 2).

Using the mask 14 for exposure, the cell pattern was formed. As a result, it was found that the first pattern group 21 and the second pattern group 22 both having a desired size could be obtained.

As in the above embodiment, only the design data (cell pattern) of the cell end is subjected to PPC processing. Thereby, it becomes possible to reduce the difference in size of the finished cell pattern at the endmost portion of the memory cell (discrepancy between the finished cell pattern and the design data). More specifically, the mask size is optimized according to the peripheral pattern environment to obtain a desired size of the cell pattern at the endmost portion of the cell. This makes it possible to produce a cell pattern of a desired size, up to the endmost portion of the cell, without using dummy patterns, i.e., increasing the area of the memory cell.

The mask size of the cell end can also be determined based on PPC processing. Thus, if the lithography process conditions are changed, it is possible to avoid the labor involved in changing the design of the cell end. In other words, the optimum mask size of the cell end can be obtained merely by changing the rule of the PPC processing according to the lithography process involved. This reduces the design load.

(Second Embodiment)

A second embodiment of the present invention will be described referring to FIG. 3 and FIG. 4.

Figure 3:
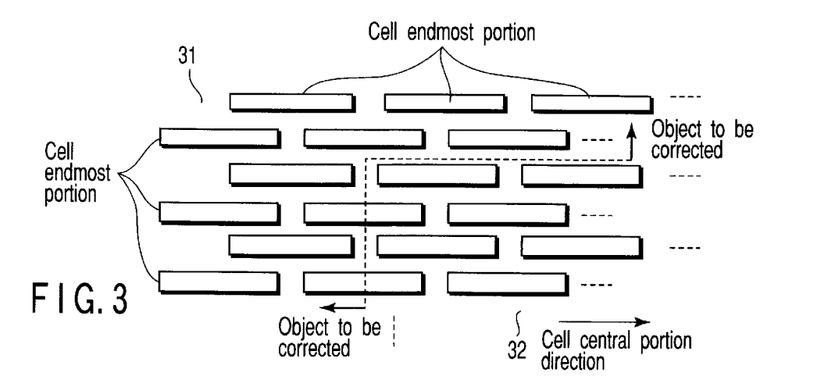
FIG. 3 is a plan view showing an example of a structure of a memory cell in a device region layer according to a second embodiment of the present invention.

FIG. 3 is a plan view showing an example of a memory cell in a device region layer. FIG. 4 is a plan view showing a mask pattern used for formation of the memory cell. This embodiment is an example to which the present invention is applied to a peripheral region of the memory cell of the device region layer. In the vicinity of the cell central portion of the peripheral region, the pattern arranged in a lattice has regularity. On the other hand, the regularity disappears in the peripheral portion of the cell. Thus, as in the first embodiment, a difference in size of the finished cell pattern occurs between the central portion and the peripheral portion of the cell. In order to avoid this, only the cell pattern in the peripheral portion is subjected to PPC processing under the condition that a sufficient lithography margin can be secured in the central portion of the cell. In this embodiment, the pattern in the peripheral region of the cell is separated into a first pattern group (object to be corrected) 31 including an endmost portion and a second pattern group 32 excluding the first pattern group 31.

Figure 4:
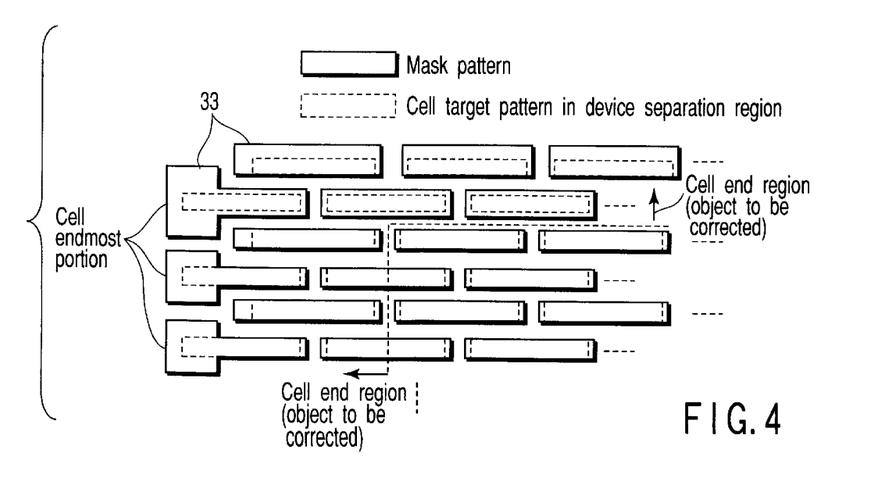
FIG. 4 is a plan view showing an example of a mask pattern used for formation of the memory cell shown in FIG. 3.

FIG. 4 shows an example of a mask 33 for exposure (mask pattern) after being corrected. In this embodiment, the region from the cell endmost portion to the region of the second line was considered a cell end region (object to be corrected), and correction (PPC processing) was performed only on the cell end region (first pattern group 31). Thus, the size of the mask pattern up to the second line is changed. The mask size in the region inside the second line (second pattern group 32) is hardly changed, and remains almost constant. Based on such a mask pattern, the mask 33 for exposure such as a photomask was formed, thereby forming the cell pattern. As a result, it was found that the first pattern group 31 and the second pattern group 32 both having a desired size could be obtained.

As in the above embodiment, only the design data (cell pattern) in the cell end is subjected to PPC processing. This makes it possible to form a cell target pattern, in the device separation region, up to the endmost portion of the cell, with a desired size, without increasing the area of the cell.

In addition, the present invention is not limited to the exposure using light. The present invention also includes the reduction in the difference in size of the finished pattern, using an etching process, mask process, and electron beam or X-ray exposure.

As the process margin, a value determined by the process variation, in at least the mask process, lithography process and etching process, may be adopted.

Further, the peripheral pattern environment may be a layout environment of another pattern existing within the maximum radius of 5 μm from each cell pattern in the first pattern group.

The region to be separated as a cell end has, in general, a size of a few μm. However, the present invention can also be applied to the case where a larger region than the above is set as a cell end.

According to the present invention, the changes in design pattern associated with changes of processes such as lithography and etching are eliminated. In general, the design of the cell or cell end is changed in accordance with the process. On the other hand, in the present invention, changing of the design of the cell or cell end is performed by data processing. Therefore, the present invention can save the designer from tasks in design changing, and improve the design efficiency. Specific examples of process changes are: change of exposure conditions (exposure wavelength, lens numerical aperture (NA), lighting system (σ, ε), and lens aberration) associated with change of an exposure apparatus; change of a resist parameter associated with change of a resist; change of a mask form associated with change of a mask drawing apparatus or mask process; change of reflection from a underlying layer or a refractive index associated with change of underlying layer; and change of etching conditions. Against these changes, an optimum mask that creates no extra design load can be formed.

Next, a method of manufacturing a semiconductor device will be described. In the method, the mask 33 for exposure formed in the second embodiment is used and patterning of a polysilicon film or a metal film is performed on the wafer 11 of silicon, or the like.

To start with, design data is formed in order to draw, as a design pattern, a device pattern of a semiconductor device such as an LSI to be formed on the wafer 11. Then, the design pattern is subjected to MDP processing and PPC processing to obtain mask data corresponding to a mask pattern in a predetermined form. The mask 33 for exposure is formed based on the mask data, in accordance with the mask manufacturing process. A film to be processed (underlying layer) such as a polysilicon layer and a metal layer is formed on the wafer 11. A resist is applied onto the film to be processed. The resist is exposed by interposing the mask 33 for exposure. The resist is developed. Afterwards, the film to be processed is patterned into a desired form, using the resist pattern as a mask.

In this manner, the mask pattern of the mask 33 for exposure is transferred to the resist, etc., on the wafer 11, using an optical projection system. The film to be processed underneath the resist is etched. Thereby, a device pattern having a pattern size substantially the same as that of the design pattern can be formed on the wafer 11.

Figure 7:
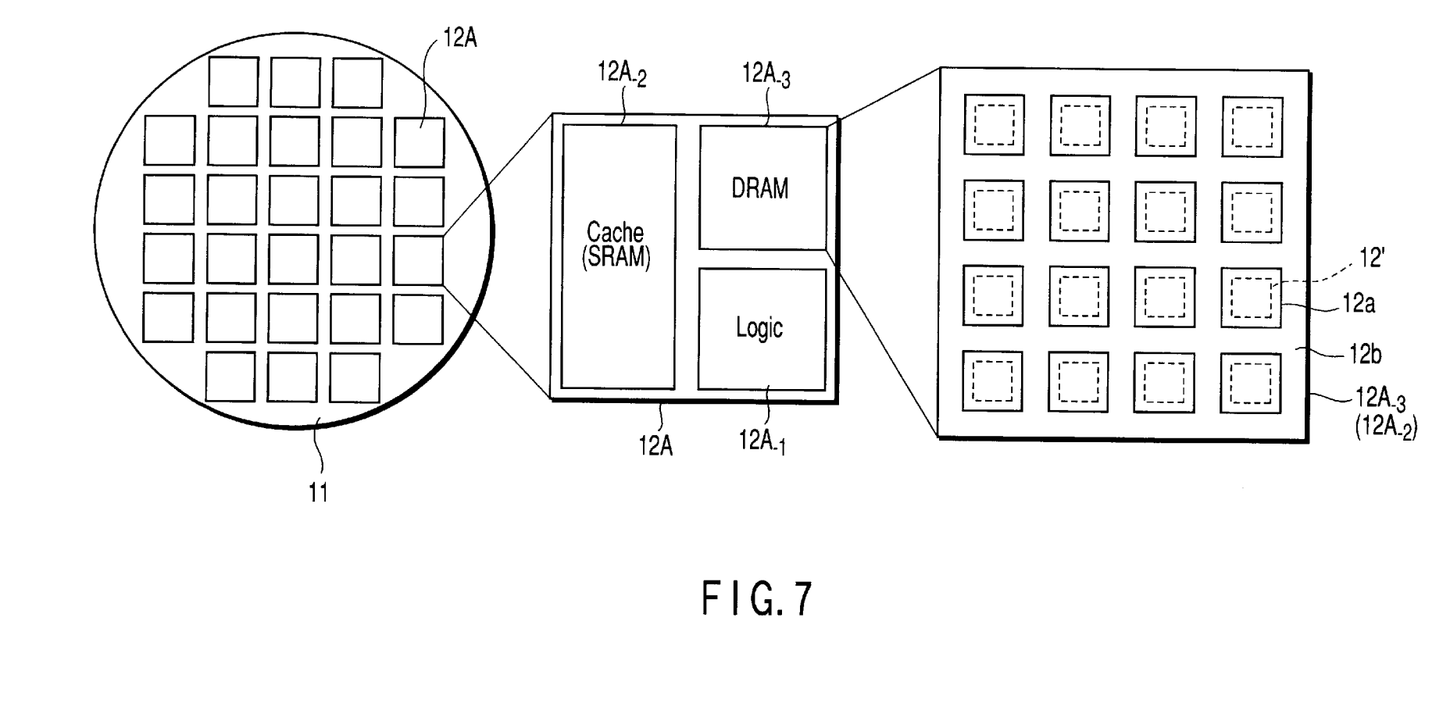
FIG. 7 is a plan view showing an example of a structure of a semiconductor wafer on which a plurality of chips having a memory-incorporated device structure are formed, according to another embodiment of the present invention.

Each of the above-described embodiments is an example to which the present invention is applied to a part of layers. However, the present invention is not limited to the above, and is also applicable to all layers of a device (memory device) having a memory cell. As shown in FIG. 7, for example, the present invention is applicable to a memory-incorporated device in which a memory (cache memory, SRAM12A-2 and DRAM12A-3), as well as a logic circuit 12A-1, is mounted on the same chip 12A.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern formation method comprising:
   separating a memory cell pattern of each of a plurality of memory cells into a first pattern group provided at a predetermined position inside from an endmost portion of a cell and a second pattern group excluding said first pattern group;
   determining a mask size of said second pattern group such that said second pattern group secures a sufficient process margin relative to a given size and size accuracy;
   optimizing a mask size of said first pattern group according to a peripheral pattern environment such that said first pattern group has a desired size under a condition for determining said mask size of said second pattern group;
   forming a mask pattern of said memory cell according to said mask size of said second pattern group determined and said mask size of said first pattern group optimized; and
   forming said cell pattern on a semiconductor wafer, using said mask pattern.

2. A pattern formation method according to claim 1, wherein said first pattern group comprises
   a plurality of patterns disposed within 5 μm at maximum from said endmost portion of said memory cell.

3. A pattern formation method according to claim 1, wherein said second pattern group comprises
   a plurality of patterns having a predetermined regularity, and said first pattern group comprises a plurality of patterns lacking said regularity.

4. A pattern formation method according to claim 1, wherein said process margin is determined by process variation in at least a lithography process and an etching process.

5. A pattern formation method according to claim 1, wherein said peripheral pattern environment is a layout environment of other patterns existing within 5 μm at maximum from said first pattern group.

6. A pattern formation method according to claim 1, wherein a resist pattern corresponding to said mask pattern is formed on said semiconductor wafer, and a underlying layer on said semiconductor wafer is etched in accordance with said resist pattern, thereby forming said cell pattern.

7. A pattern formation method according to claim 1, wherein a plurality of chips are formed on said semiconductor wafer on which said cell pattern is formed, and a logic circuit is mounted on each of said chips.

8. A pattern formation method according to claim 1, wherein said mask size of said first pattern group is optimized by performing PPC (Process Proximity Correction) processing on cell patterns at an end portion of said plurality of memory cells.

9. A method of manufacturing a mask for exposure comprising:
   separating a memory cell pattern of each of a plurality of memory cells into a first pattern group provided at a predetermined position inside from an endmost portion of a cell and a second pattern group excluding said first pattern group;
   determining a mask size of said second pattern group such that said second pattern group secures a sufficient process margin relative to a given size and size accuracy;
   optimizing a mask size of said first pattern group according to a peripheral pattern environment such that said first pattern group has a desired size under a condition for determined said mask size of said second pattern group; and
   forming a mask pattern of said memory cell according to said mask size of said second pattern group determined and said mask size of said first pattern group optimized.

10. A method of manufacturing a mask for exposure according to claim 9, wherein said first pattern group comprises a plurality of patterns disposed within 5 μm at maximum from the endmost portion of said memory cell.

11. A method of manufacturing a mask for exposure according to claim 9, wherein said second pattern group comprises a plurality of patterns having a predetermined regularity, and said first pattern group comprises a plurality of patterns lacking said regularity.

12. A method of manufacturing a mask for exposure according to claim 9, wherein said process margin is determined by process variation in at least a lithography process and an etching process.

13. A method of manufacturing a mask for exposure according to claim 9, wherein said peripheral pattern environment is a layout environment of other patterns existing within 5 μm at maximum from said first pattern group.

14. A method of manufacturing a mask for exposure according to claim 9, wherein said mask size of said first pattern group is optimized by performing PPC (Process Proximity Correction) processing on cell patterns at an end portion of said plurality of memory cells.

15. A mask for exposure used when a memory cell pattern of a plurality of memory cells comprises a first pattern group provided at a predetermined position inside from an endmost portion of a cell, and a second pattern group excluding said first pattern group, wherein said mask for exposure comprises a mask pattern of said memory cell formed according to a mask size of said first pattern group and a mask size of said second pattern group, said mask size of said second patter group which forms said mask pattern is determined by such a condition that said second pattern group secures a sufficient process margin relative to a given size and size accuracy, and said mask size of said first pattern group which forms said mask pattern is optimized according to a peripheral pattern environment such that said first pattern group has a desired size under said condition.

16. A mask for exposure according to claim 15, wherein said first pattern group comprises a plurality of patterns disposed within 5 μm at maximum from the endmost portion of said memory cell.

17. A mask for exposure according to claim 15, wherein said second pattern group comprises a plurality of patterns having a predetermined regularity, and said first pattern group comprises a plurality of patterns lacking said regularity.

18. A mask for exposure according to claim 15, wherein said process margin is determined by process variation in at least a lithography process and an etching process.

19. A mask for exposure according to claim 15, wherein said peripheral pattern environment is a layout environment of other patterns existing within 5 μm at maximum from said first pattern group.

20. A mask for exposure according to claim 15, wherein said optimization of said first pattern group is carried out by performing PPC (Process Proximity Correction) processing on cell patterns at an end portion of said plurality of memory cells.

* * * * *

UNITED STATES PATENT AND TRADEMARK OFFICE
CERTIFICATE OF CORRECTION

PATENT NO. : 6,727,028 B2
DATED : April 27, 2004
INVENTOR(S) : Kotani et al.

It is certified that error appears in the above-identified patent and that said Letters Patent is hereby corrected as shown below:

Column 8,
Line 36, change "determined" to -- determining --.

Column 9,
Line 5, change "patter" to -- pattern --.

Signed and Sealed this

Sixth Day of July, 2004

JON W. DUDAS
*Acting Director of the United States Patent and Trademark Office*